(12) United States Patent
Zhang

(10) Patent No.: US 9,042,102 B2
(45) Date of Patent: May 26, 2015

(54) WATERPROOF CONTROLLER USED FOR ELECTRIC POWER STEERING

(75) Inventor: An-Jun Zhang, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 281 days.

(21) Appl. No.: 13/611,540

(22) Filed: Sep. 12, 2012

(65) Prior Publication Data

US 2013/0286597 A1    Oct. 31, 2013

(30) Foreign Application Priority Data

Apr. 27, 2012    (CN) .......................... 2012 1 0131113

(51) Int. Cl.
*H05K 5/06* (2006.01)
*H05K 7/20* (2006.01)
*H05K 5/00* (2006.01)

(52) U.S. Cl.
CPC .............. *H05K 5/0056* (2013.01); *H05K 5/069* (2013.01)

(58) Field of Classification Search
CPC .............................. H05K 5/0056; H05K 5/069
USPC ........... 174/50, 520, 559, 564, 658, 663, 668; 439/76.2, 870; 361/704, 720
See application file for complete search history.

(56) References Cited

U.S. PATENT DOCUMENTS

| 5,378,174 | A | * | 1/1995 | Brownlie et al. | ............. 439/709 |
| 5,595,073 | A | * | 1/1997 | Sullivan | ............................ 70/18 |
| 6,129,583 | A | | 10/2000 | Lok | |
| 7,459,630 | B2 | * | 12/2008 | Pinol Pedret et al. | ........... 174/50 |

FOREIGN PATENT DOCUMENTS

| CN | 2399602 | | 10/2000 | | |
| CN | 2418549 | | 2/2001 | | |
| CN | 1691446 | | 11/2005 | | |
| EP | 1633015 | A1 | * | 3/2006 | ............... H01Q 1/42 |

* cited by examiner

*Primary Examiner* — Robert J Hoffberg
(74) *Attorney, Agent, or Firm* — Lowe Hauptman & Ham, LLP

(57) ABSTRACT

A waterproof controller used for electric power steering includes a shell, a chamber, at least one sealing block, a circuit board, at least one cable, and at least one board mounting accessory. The chamber is formed in the shell. The sealing block is disposed on the shell, and includes at least one hole. The circuit board is accommodated in the chamber. The cable includes a first terminal and a second terminal opposite to the first terminal. The first terminal passes through the hole of the sealing block. The board mounting accessory covers the second terminal, in which the board mounting accessory and the second terminal insert into the circuit board together.

13 Claims, 8 Drawing Sheets

WATERPROOF CONTROLLER USED FOR ELECTRIC POWER STEERING

RELATED APPLICATIONS

This application claims priority to Chinese Application Serial Number 201210131113.6, filed on Apr. 27, 2012, which is herein incorporated by reference.

BACKGROUND

1. Field of Invention

Embodiments of the present invention relate to a controller for car. More particularly, embodiments of the present invention relate to a waterproof controller used for electric power steering.

2. Description of Related Art

Electronic devices are increasingly being applied in vehicles. An example is EPS (electric power steering) which is used in place of traditional mechanical steering, HPS (hydraulic power steering), and EHPS (electric hydraulic power steering). Because EPS is more energy-efficient and is easier to control than mechanical or hydraulic steering, it is widely used for vehicles, such as automobiles.

In EPS, a controller is indispensable. The controller is used to detect the steering wheel angle and to correspondingly control the steering mechanism.

Many electronic elements are installed in the controller. Some elements may be damaged when water enters into the controller. Once this occurs, the steering system may fail to operate, severely affecting driving safety.

In order to make a waterproof controller, a waterproof shell is typically provided to cover the controller. However, with such a configuration, additional connecting devices (such as male and female connectors) are required between the controller and the waterproof shell, so that the electric signals in the controller can be transmitted to other devices in the steering system. These additional connecting devices not only increase the cost of the controller, but also reduce the reliability thereof.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment of the present invention, a waterproof controller used for electric power steering includes a shell, a chamber, at least one sealing block, a circuit board, at least one cable, and at least one board mounting accessory. The chamber is formed in the shell. The sealing block is disposed on the shell, and includes at least one hole. The circuit board is accommodated in the chamber. The cable includes a first terminal and a second terminal opposite to the first terminal. The first terminal passes through the hole of the sealing block. The board mounting accessory covers the second terminal, in which the board mounting accessory and the second terminal insert into the circuit board together.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
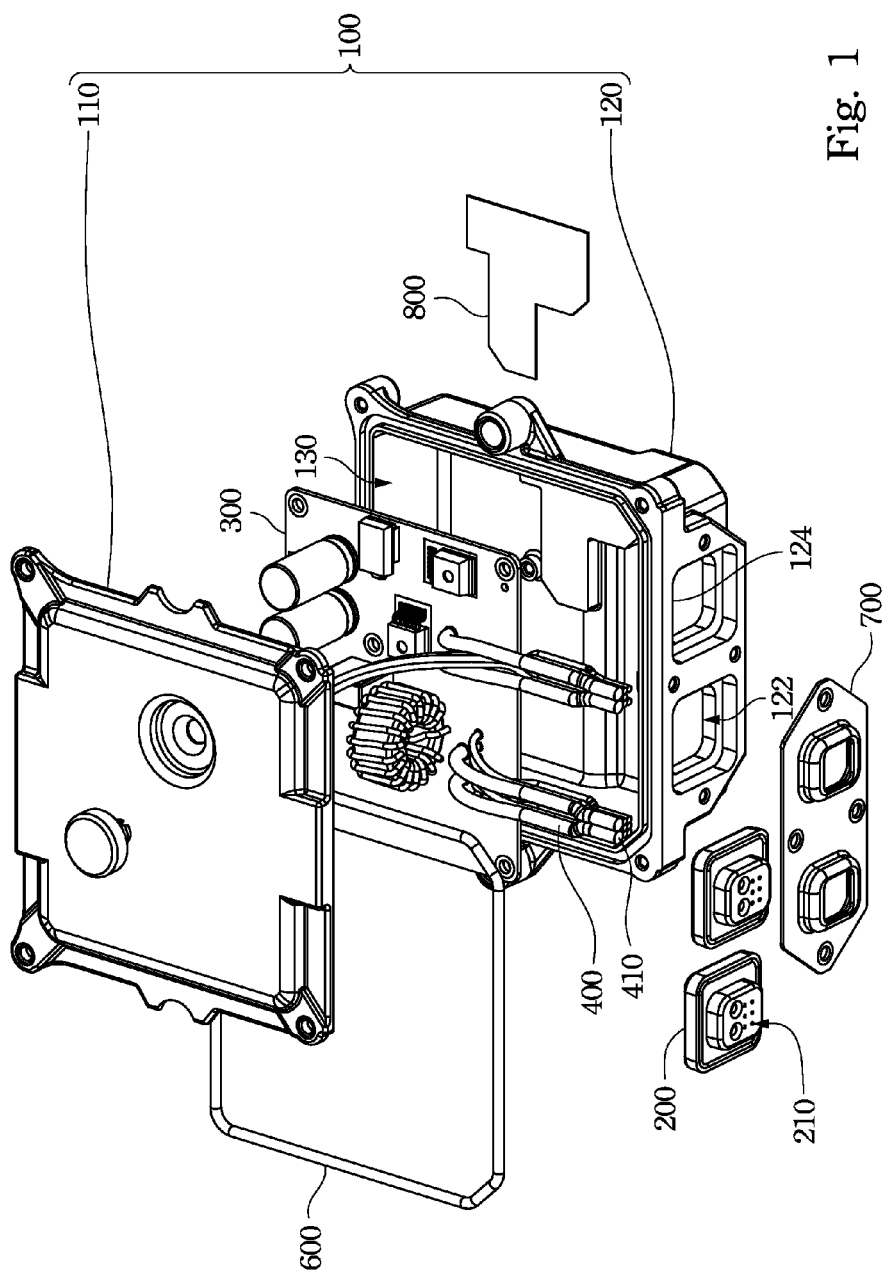
FIG. 1 is an exploded perspective view of a waterproof controller used for electric power steering in accordance with one embodiment of the present invention.

With reference to the present embodiments of the invention, examples of which are illustrated in the accompanying drawings. Wherever possible, the same reference numbers are used in the drawings and the description to refer to the same or like parts.

Figure 2:
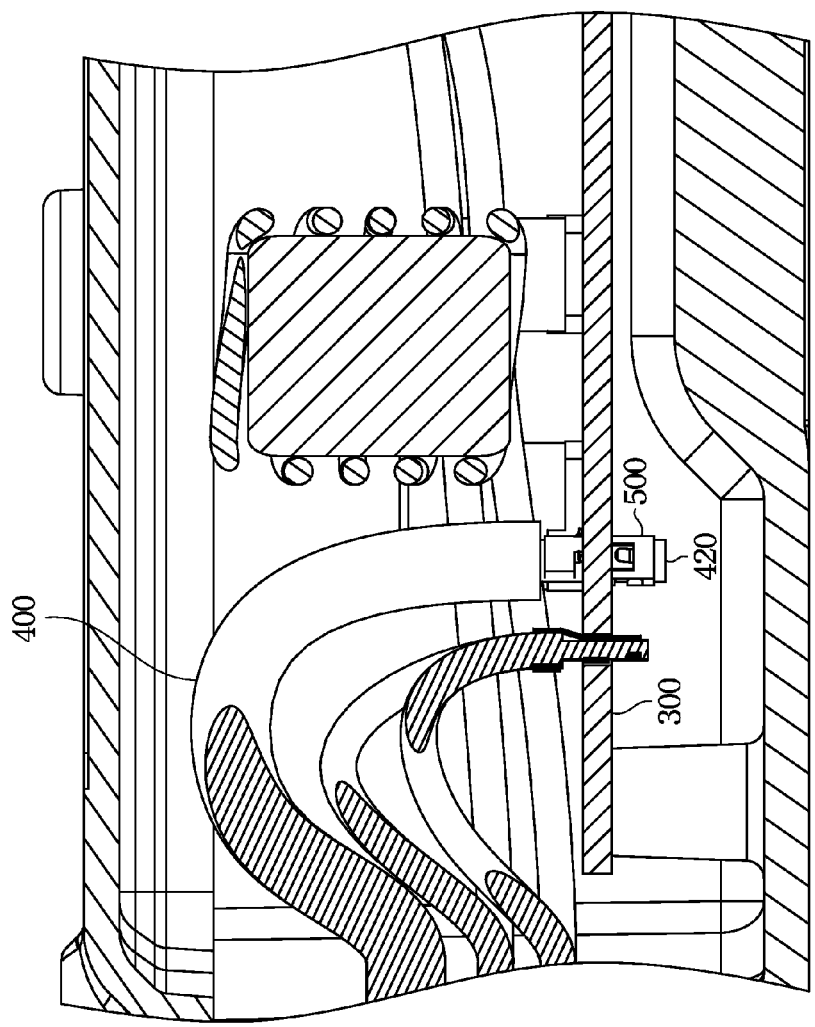
FIG. 2 is a partial cross-sectional view of the waterproof controller of FIG. 1.

FIG. 1 is an exploded perspective view of a waterproof controller used for electric power steering in accordance with one embodiment of the present invention. FIG. 2 is a partial cross-sectional view of the waterproof controller of FIG. 1. As shown in these figures, the controller of the embodiment includes a shell 100, a chamber 130, at least one sealing block 200, a circuit board 300, at least one cable 400, and at least one board mounting accessory 500. The chamber 130 is formed in the shell 100. The sealing block 200 is disposed on the shell 100 and includes at least one hole 210. The circuit board 300 is accommodated in the chamber 130. The cable 400 includes a first terminal 410 and a second terminal 420 opposite to the first terminal 410. The first terminal 410 passes through the hole 210 of the sealing block 200. The board mounting accessory 500 covers the second terminal 420 of the cable 400, in which the board mounting accessory 500 and the second terminal 420 insert into the circuit board 300 together.

In this embodiment of the present invention, the board mounting accessory 500 is used to fix the second terminal 420 of the cable 400 on the circuit board 300, and the first terminal 410 of the cable 400 can pass through the hole 210 of the sealing block 200 and can be connected to connectors or converting terminals outside of the controller, such as a connector, a ring terminal, or a y-shaped terminal. Therefore, signals of all electronic devices on the circuit board 300 can be directly transmitted out of the shell via the cable 400 without making use of any connector disposed on the shell 100, so that the cost of the waterproof controller can be lowered down and the reliability thereof can be increased.

Figure 3:
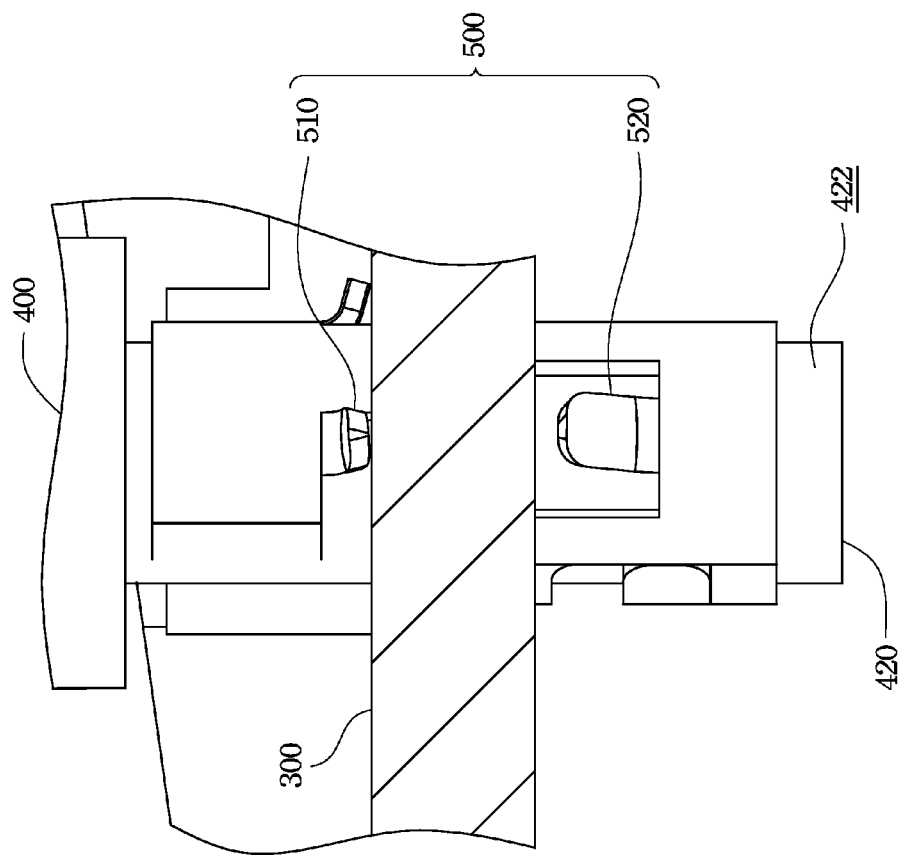
FIG. 3 is a side view of a board mounting accessory and related elements in accordance with one embodiment of the present invention.

FIG. 3 is a side view of the board mounting accessory 500 and related elements in accordance with one embodiment of the present invention. As shown in the figure, the board mounting accessory 500 may include a first reverse hook 510. The first reverse hook 510 is pressed on the circuit board 300. Therefore, when the second terminal 420 of the cable 400 and the board mounting accessory 500 insert into the circuit board 300 together, the circuit board 300 can block the first reverse hook 510, thereby preventing the board mounting accessory 500 and the second terminal 420 from moving downwards.

In some embodiments, the board mounting accessory 500 may further include a second reverse hook 520. The first reverse hook 510 and the second reverse hook 520 are respectively positioned on opposite sides of the circuit board 300. For example, the first reverse hook 510 can be positioned above the circuit board 300 to prevent the board mounting accessory 500 and the second terminal 420 from moving downwards. The second reverse hook 520 can be positioned beneath the circuit board 300 to prevent the board mounting accessory 500 and the second terminal 420 from moving upwards. Therefore, the first reverse hook 510 and the second reverse hook 520 can limit the board mounting accessory 500 and the second terminal 420 from moving along the vertical direction, so as to fix the cable 400 in place on the circuit board 300.

It should be noted that "vertical direction" as used herein refers to a direction that is perpendicular to the circuit board 300.

In some embodiments, the second terminal 420 of the cable 400 has an axial surface 422, and the first reverse hook 510 and the second reverse hook 520 are provided at an angle relative to the axial surface 422. That is, the first reverse hook 510 and the second reverse hook 520 are tilted at an angle relative to the axial surface 422, rather than closely contacting the axial surface 422. Therefore, if the cable 400 is pulled along the direction from the second terminal 420 to the first terminal 410, the second reverse hook 520 can be blocked by the circuit board 300, thereby preventing the second terminal 420 from being removed from the circuit board 300. Further, the circuit board 300 can block the first reverse hook 510, so as to prevent the second terminal 420 from moving downwards.

It should be noted that the axial surface 422 of the cable 420 refers to the surface parallel to the axis of the cable 400. In other words, the axial surface 422 is perpendicular to the radial direction of the cable 400.

Referring back to FIG. 1, in some embodiments, the shell 100 includes a first shell body 110 and a second shell body 120. The first shell body 110 is placed on the second shell body 120. The second shell body 120 includes at least one opening 122, and the sealing block 200 is tightly fitted in the opening 122. Specifically, the opening 122 is formed on a lateral wall of the second shell body 120, and the shape and size of the opening 122 is such that the sealing block 200 can be fitted tightly therein. Therefore, when the sealing block 200 is fitted in the opening 122, no gap will exist between the sealing block 200 and the opening 122, and the waterproof function can be achieved. For example, the sealing block 200 may be square, and the size and shape of the opening 122 can be substantially the same as the size and shape of the sealing block 200.

In some embodiments, the sealing block 200 can be made of elastic material such as rubber. Therefore, when it is desired to place the sealing block 200 into the opening 122, the sealing block 200 can be pushed so as to undergo elastic deformation and thereby realize an interference fit between the sealing block 200 and the opening 122. That is, after the sealing block 200 is put into the opening 122, it can expand based on the inherent elastic ability thereof, so that the sealing block 200 can be tightly fitted into the opening 122 and thereby promote the waterproof ability of the waterproof controller.

In some embodiments, the waterproof controller may further include a waterproof ring 600. The waterproof ring 600 is clamped between the first shell body 110 and the second shell body 120. For example, the waterproof ring 600 can be made of elastic material such as rubber. The waterproof ring 600 can be used to fill gaps between the first shell body 110 and the second shell body 120. By using both the sealing block 200 and the waterproof ring 600, water can be prevented from entering into the controller of the present invention. The waterproof ring 600 may include an O-ring, but the present invention is not limited in this regard.

In some embodiments, the second shell body 120 may further include at least one beam 124. The beam 124 is positioned between the sealing block 200 and the waterproof ring 600. Specifically, the opening 122 is formed under the beam 124, and, as described above, the sealing block 200 is put into the opening 122. The waterproof ring 600 is disposed on the beam 124. In other words, the waterproof ring 600 and the sealing block 200 are respectively disposed on the opposite sides of the beam 124.

Figure 4:
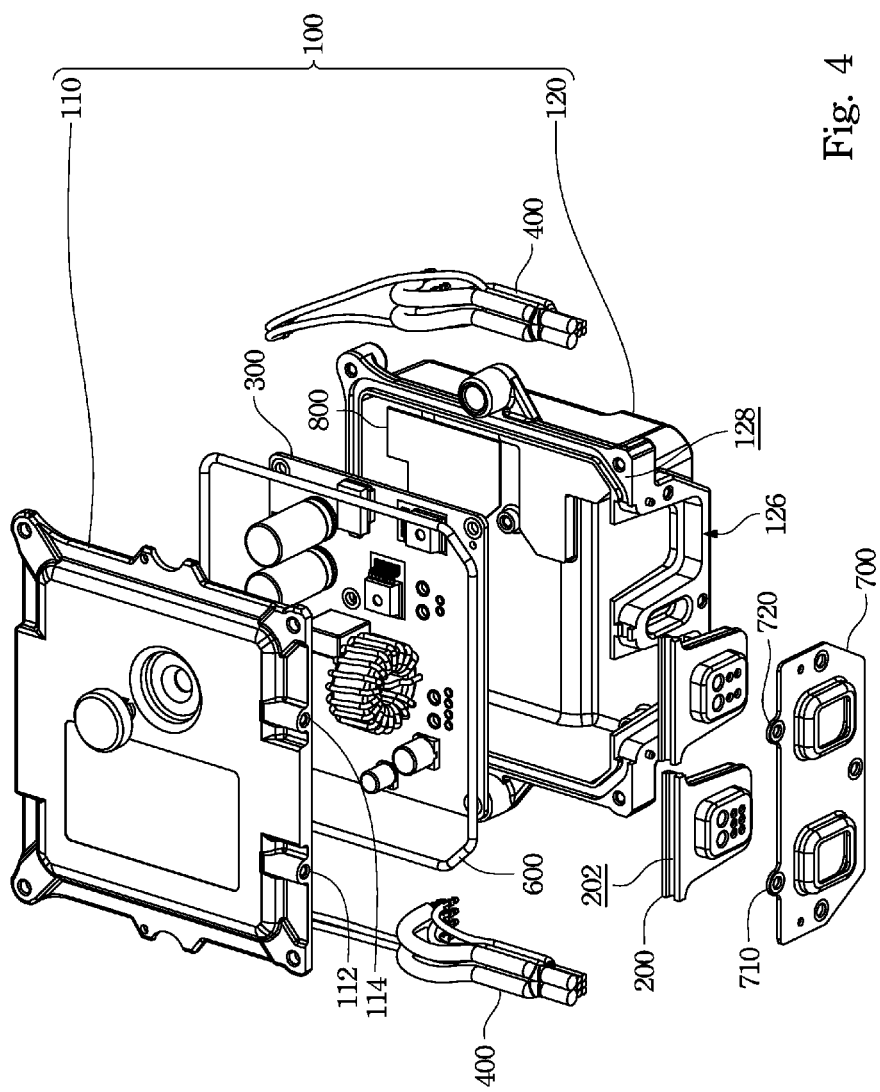
FIG. 4 is an exploded perspective view of the waterproof controller in accordance with another embodiment of the present invention.

FIG. 4 is an exploded perspective view of the waterproof controller in accordance with another embodiment of the present invention. This embodiment is similar to FIG. 1, and the main difference is that the second shell body 120 of the embodiment includes at least one recess 126. The sealing block 200 is disposed in the recess 126. The sealing block 200 includes a holding surface 202. The second shell body 120 includes a supporting surface 128. The supporting surface 128 of the second shell body 120 and the holding surface 202 of the sealing block 200 support the waterproof ring 600 together.

In addition to the advantages of the waterproof controller of FIG. 1, this embodiment can provide further advantages. In particular, because the beam 124 is omitted from the configuration of the second shell body 120, only the cable 400, the circuit board 300 and the sealing block 200 are required under performance of a wave-soldering process, and the sealing block 200 can be disposed in the recess 126 after the wave-soldering process is performed. Therefore, the second shell body 120 is not required under performance of the wave-soldering process. In contrast, with the configuration shown in FIG. 1, due to the existence of the beam 124, the sealing block 200 must be fitted into the opening 122 in advance of the wave-soldering process, otherwise the sealing block 200 will be blocked by the beam 124 if assembly is performed after the wave-soldering process, making it difficult to fit the sealing block 200 in the opening 122. Therefore, in FIG. 1, the cable 400, the circuit board 300, the sealing block 200 and the second shell body 120 are required under performance of the wave-soldering process, and this is inconvenient. Therefore, compared to FIG. 1, the embodiment of FIG. 4 can further promote convenience during assembly process.

The recess 126 is a groove that extends downwards from the supporting surface 128. In other words, the supporting surface 128 of the second shell body 120 is a discontinuous surface, such that the sealing block 200 can be inserted into or pulled out of the recess 126 along the direction that is perpendicular to the supporting surface 128. Therefore, the wave-soldering process can be performed with the cable 400, the circuit board 300 and the sealing block 200 without the second shell body 120, and the sealing block 200 can be inserted into the recess 126 along the direction perpendicular to the supporting surface 128 following the wave-soldering process, thereby promoting convenience during assembly process.

Figure 5:
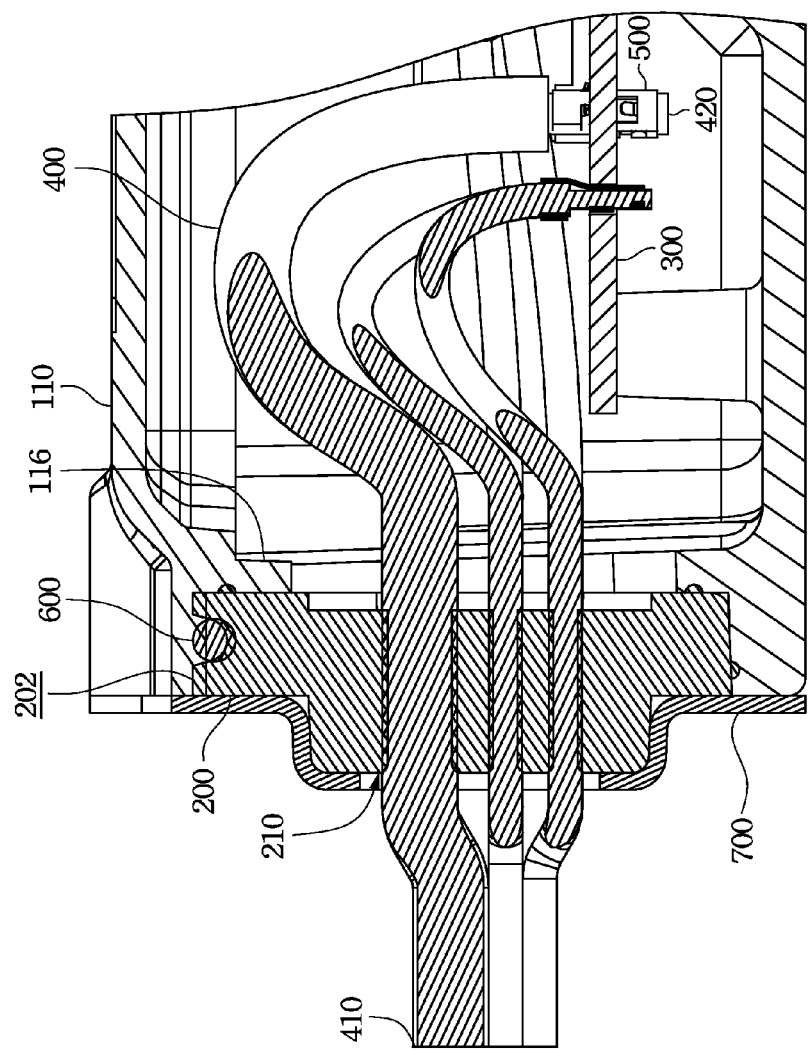
FIG. 5 is a partial cross-sectional view of the waterproof controller of FIG. 4.

FIG. 5 is a partial cross-sectional view of the waterproof controller of FIG. 4. As shown in this figure, the holding surface 202 of the sealing block 200 may directly contact part of the waterproof ring 600. Specifically, the sealing block 200 and the waterproof ring 600 can be fitted to each other. For example, the waterproof ring 600 may include an arc-shaped surface, and the sealing block 200 may includes a corresponding arc-shaped groove. The waterproof ring 600 and the sealing block 200 can be fitted tightly together through such a corresponding structure, so as to prevent water from entering into the controller.

Referring back to FIG. 4, in some embodiments, the supporting surface 128 of the second shell body 120 and the holding surface 202 of the sealing block 200 are substantially at the same height, so that they can support the waterproof ring 600 together, and the waterproof ring 600 is not be deformed at the interface between the supporting surface 128 and the holding surface 202. In another aspect, the holding surface 202 of the sealing block 200 can replace the beam 124 in FIG. 1

Figure 6:
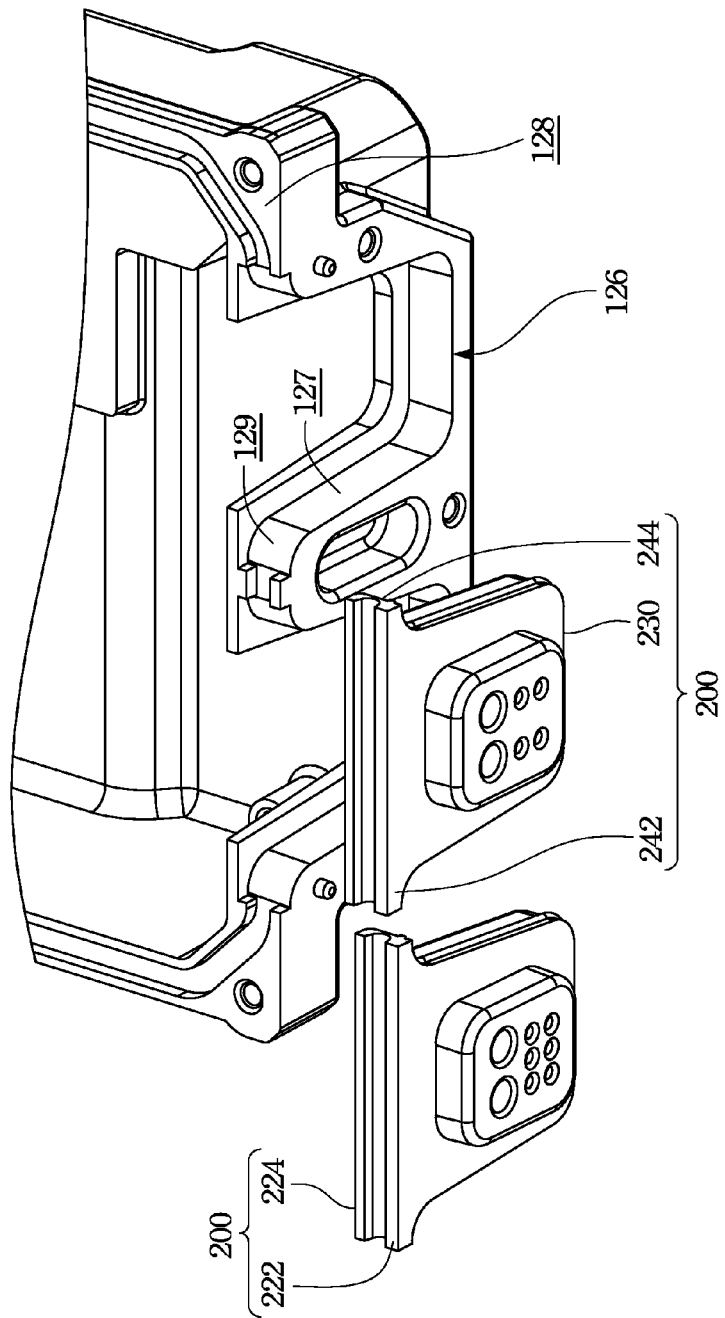
FIG. 6 is a partial exploded perspective view of the waterproof controller of FIG. 4.

FIG. 6 is a partial exploded perspective view of the waterproof controller of FIG. 4. As shown in this figure, the sealing block 200 may include two top walls 222 and 224. The top walls 222 and 224 can cooperate to fix the waterproof ring 600, so as to support the waterproof ring 600 and to prevent the waterproof ring 600 from moving or being removed from between the sealing block 200 and the first shell body 110. Referring to FIG. 5, the first shell body 110 may include at least one support 116. The support 116 supports the sealing block 200, so that the sealing block 200 can be fixed in position, and the top walls 222 and 224 can be prevented from moving. Therefore, the waterproof ring 600 can be further supported and fixed.

Specifically, the support 116 is protruded on the inner surface of the first shell body 110 that faces the sealing block 200 and the cable 400. The support 116 can be a plate that presses on the sealing block 200. In some embodiments, the first shell body 110 may include a plurality of supports 116 (e.g., two or three) for providing greater support.

Referring to FIG. 6, in some embodiments, the sealing block 200 may include a block body 230 and two lugs 242 and 244. The lugs 242 and 244 are protruded on opposite sides of the block body 230. The lug 242 and the block body 230 form a round corner, and the lug 244 and the block body 230 also form a round corner. In order to fit the sealing block 200 tightly in the recess 126, the recess 126 also has a round wall 129 and a standing wall 127. The shape and the size of the round wall 129 are substantially the same as the shape and the size of the round corner formed by the lug 242 or 244 and the block body 230. The shape and the size of the standing wall 127 are substantially the same as the shape and the size of the block body 230.

In some embodiments, the sealing block 200 can be made of elastic material such as rubber. Therefore, when it is desired to place the sealing block 200 into the recess 126, the sealing block 200 can be pushed so as to undergo elastic deformation and thereby realize an interference fit between the sealing block 200 and the recess 126. That is, after the sealing block 200 is put into the recess 126, it can expand based on the inherent elastic ability thereof, so that the sealing block 200 can be tightly fitted into the recess 126 and thereby promote the waterproof ability of the waterproof controller.

Referring back to FIG. 4, in some embodiments, the waterproof controller may further include a front cover 700 for fixing the sealing block 200 on the shell 100. For example, the front cover 700 can include two locking holes 710 and 720, and the first shell 110 can include two locking slots 112 and 114 corresponding respectively to the locking holes 710 and 720. The shape and the size of each of the locking holes 710 and 720 are substantially the same as the shape and the size of the corresponding locking slot 112 or 114, so that locking elements (such as screws) can be used to fix the front cover 700 on the shell 100, thereby preventing the sealing block 200 from being removed from the shell 100.

In some embodiments, the waterproof controller may further include a heat dissipating plate 800 contacting the circuit board 300, so as to dissipate heat from the circuit board 300.

Figure 7B:
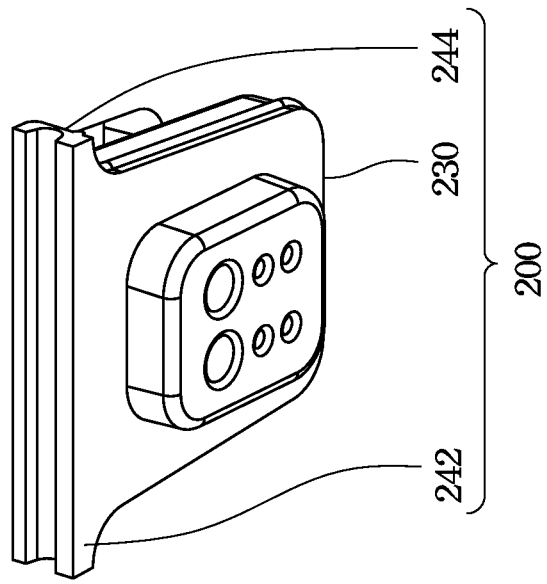
FIGS. 7A-7C are perspective views of a sealing block in accordance with various embodiments of the present invention.
Figure 7A:
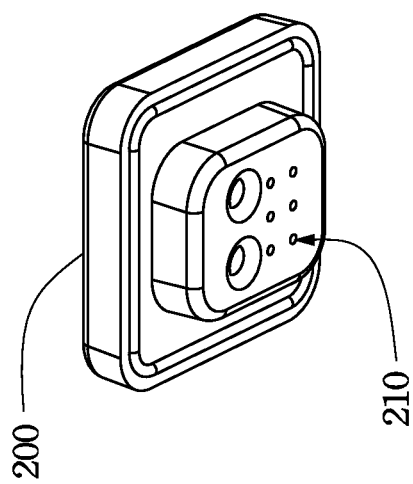
Figure 7C:
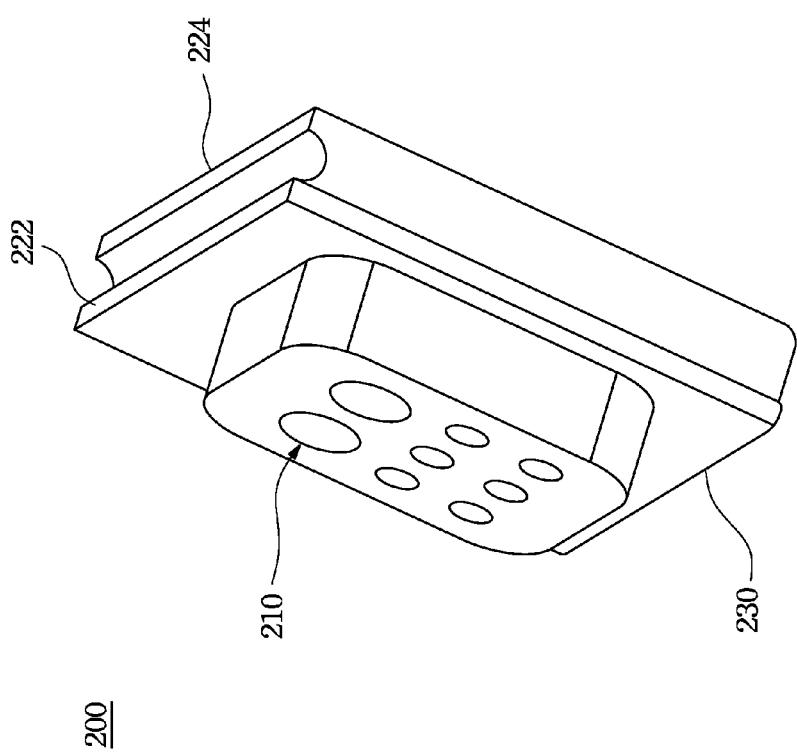

FIGS. 7A-7C are perspective views of the sealing block 200 in accordance with various embodiments of the present invention. Specifically, in FIG. 7A, the sealing block 200 is similar to the configuration shown in FIG. 1. In this case, the sealing block 200 is placed in the opening 122 (see FIG. 1). In FIG. 7B, the sealing block 200 is similar to the configuration shown in FIG. 4, and in this case, the sealing block 200 is placed in the recess 126 (see FIG. 4). It should be noted that the sealing block 200 in FIG. 7B is not suitable for use with the second shell body 120 with the beam 124 as shown in FIG. 1 because the sealing block 200 in FIG. 7B has a configuration that can directly replace the beam 124 in FIG. 1 to support the waterproof ring 600. Stated differently, the sealing block 200 in FIG. 7B would not fit snugly in the opening 122 of FIG. 1 due to the configuration used to replace the beam 124 of FIG. 1. Moreover, the sealing block 200 in FIG. 7A is not suitable for use with the second shell body 120 without the beam 124 (see FIG. 4) because the sealing block 200 in FIG. 7A does not have top walls 222 and 224 to support the waterproof ring 600 (i.e., does not have a configuration to replace the beam 124 of FIG. 1).

Further, the sealing block 200 in FIG. 7C is substantially the same as the configuration shown in FIG. 7B. The sealing block 200 in FIG. 7C also includes a block body 230, two top walls 222 and 224 and at least one hole 210. The main difference is that the sealing block 200 of FIG. 7C omits the lugs 242 and 244 of the sealing block 200 shown in FIG. 7B, so as to facilitate manufacture of the sealing block 200. Because the sealing block 200 in FIG. 7C also has top walls 222 and 224, it is also suitable for use with the second shell body 120 without the beam 124 (see FIG. 4) and is not suitable for use with the second shell body 120 with the beam 124 (see FIG. 1).

The aforementioned embodiments only introduce some possible variations of the sealing block 200. In practice, the shape of the sealing block 200 may be square, circular, elliptic, rectangular, triangular, and so on, depending on the user's demands, and the present invention is not limited in this regard. It should be noted that the recess 126 should also be modified in shape to correspond to the shape of the sealing block 200, so that the sealing block 200 can be tightly fitted into the recess 126.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A waterproof controller used for electric power steering, comprising:
   a shell, the shell comprising a first shell body and a second shell body on which is placed the first shell body;
   a chamber formed in the shell;
   at least one sealing block disposed on the shell, each of the at least one sealing block having at least one hole;
   a front cover for fixing each of the at least one sealing block on the shell, the front cover comprises a plurality of locking holes, and the first shell comprises a plurality of locking slots corresponding respectively to the locking holes, and a shape and a size of each of the locking holes is substantially a same as a shape and a size of a corresponding locking slot of the locking holes;

a circuit board accommodated in the chamber; at least one cable having a first terminal and a second terminal, the first terminal and the second terminal being opposite to each other, the first terminal passing through a respective hole of the at least one hole of a respective sealing block of the at least one sealing block; and a board mounting accessory covering the second terminal of each of the at least one cable, the board mounting accessory and the second terminal inserting into the circuit board together.

2. The waterproof controller of claim 1, wherein the board mounting accessory comprises a first reverse hook that is pressed on the circuit board.

3. The waterproof controller of claim 2, wherein the board mounting accessory further comprises a second reverse hook, and the first reverse hook and the second reverse hook are respectively positioned on opposite sides of the circuit board to prevent the second terminal of a respective cable of the at least one cable from moving.

4. The waterproof controller of claim 3, wherein the second terminal of the respective cable of the at least one the cable has an axial surface, and the first reverse hook and the second reverse hook are tilted at an angle relative to the axial surface.

5. The waterproof controller of claim 1, wherein the second shell body having at least one opening, the respective sealing block of the at least one sealing block being tightly fitted in each of the at least one opening.

6. The waterproof controller of claim 5, further comprising a waterproof ring clamped between the first shell body and the second shell body.

7. The waterproof controller of claim 6, wherein the second shell body comprises at least one beam positioned between the respective sealing block of the at least one sealing block and the waterproof ring.

8. The waterproof controller of claim 1, further comprising a heat dissipating plate contacting the circuit board.

9. The waterproof controller of claim 1, further comprising a waterproof ring, the waterproof ring being clamped between the first shell body and the second shell body, the second shell body having at least one recess, each of the at least one sealing block being disposed in a respective recess of the at least one recess, each of the at least one sealing block having a holding surface, the second shell body having a supporting surface, the supporting surface of the second shell body and the holding surface of each of the at least one sealing block supporting the waterproof ring together.

10. The waterproof controller of claim 9, wherein the holding surface of each of the at least one sealing block directly contacts part of the waterproof ring.

11. The waterproof controller of claim 9, wherein the supporting surface of the second shell body and the holding surface of each of the at least one sealing block are substantially at a same height.

12. The waterproof controller of claim 9, wherein each of the at least one sealing block comprises two top walls fixing the waterproof ring together, and the first shell body comprises at least one support supporting a respective sealing block of the at least one sealing block.

13. The waterproof controller of claim 9, wherein each of the at least one sealing block comprises a block body; and two lugs protruded on opposite sides of the block body, a respective lug of the two lugs and the block body each forming a round corner.

\* \* \* \* \*